United States Patent [19]

Cautley

[11] Patent Number: 5,649,285
[45] Date of Patent: Jul. 15, 1997

[54] TRANSMISSION OF TUNING DATA OF BROADCASTING TRANSMITTERS TO A RECEIVER TO FACILITATE AUTOMATED SET-UP OF THE RECEIVER BASED ON RECEIVABLE TRANSMITTERS IN A RECEPTION AREA

[75] Inventor: Hugh Cautley, Vienna, Austria

[73] Assignee: U.S. Philips Corporation, New York, N.Y.

[21] Appl. No.: 405,067

[22] Filed: Mar. 16, 1995

[30] Foreign Application Priority Data

Mar. 23, 1994 [EP] European Pat. Off. ............... 94104597
Apr. 21, 1994 [EP] European Pat. Off. ............... 94201103

[51] Int. Cl.⁶ ..................................................... H04N 7/10
[52] U.S. Cl. ............................ 455/6.2; 455/3.1; 348/10; 348/468; 348/467
[58] Field of Search .................................. 348/6, 8, 9, 10, 348/461, 467, 468, 473, 476, 731, 732, 735, 906; 455/3.1, 4.2, 6.1, 6.2, 6.3

[56] References Cited

U.S. PATENT DOCUMENTS

| 4,894,714 | 1/1990 | Christis | 358/86 |
| 5,371,550 | 12/1994 | Shibutani et al. | 348/735 X |
| 5,424,770 | 6/1995 | Schmelzer et al. | 348/9 |

FOREIGN PATENT DOCUMENTS 0263555  4/1988  European Pat. Off. .

OTHER PUBLICATIONS

"Computer Controlled Teletext", by J.R. Kinghorn, Electronic Components and Applications, vol. 6, No. 1, 1984.
EACEM Technical Note 001/94-01-17 draft 2.0, Jan. 14, 1994.
Pending Patent applications, PHN 14,460 and PHN 14,461.

*Primary Examiner*—John K. Peng
*Assistant Examiner*—Nathan J. F. Lynn
*Attorney, Agent, or Firm*—Edward W. Goodman

[57] ABSTRACT

Device and method for transmitting tuning data (transmission frequency, channel number) of broadcasting transmitters to receivers for user-friendly installation of the receivers. To this end, the device transmits tuning data packets. Each tuning data packet includes the tuning data of the transmitters which are receivable in a given area. Moreover, a reference packet (FIG. 3) is transmitted, in which the corresponding tuning data packet (32) is fixed for each area (34). In order to automate the installation without user interaction, the reference packet for each area incorporates the tuning data (31) of a transmitter which can be received only in that area using the tuning data. Where necessary, the tuning data is supplemented with a recognition label (33).

10 Claims, 5 Drawing Sheets

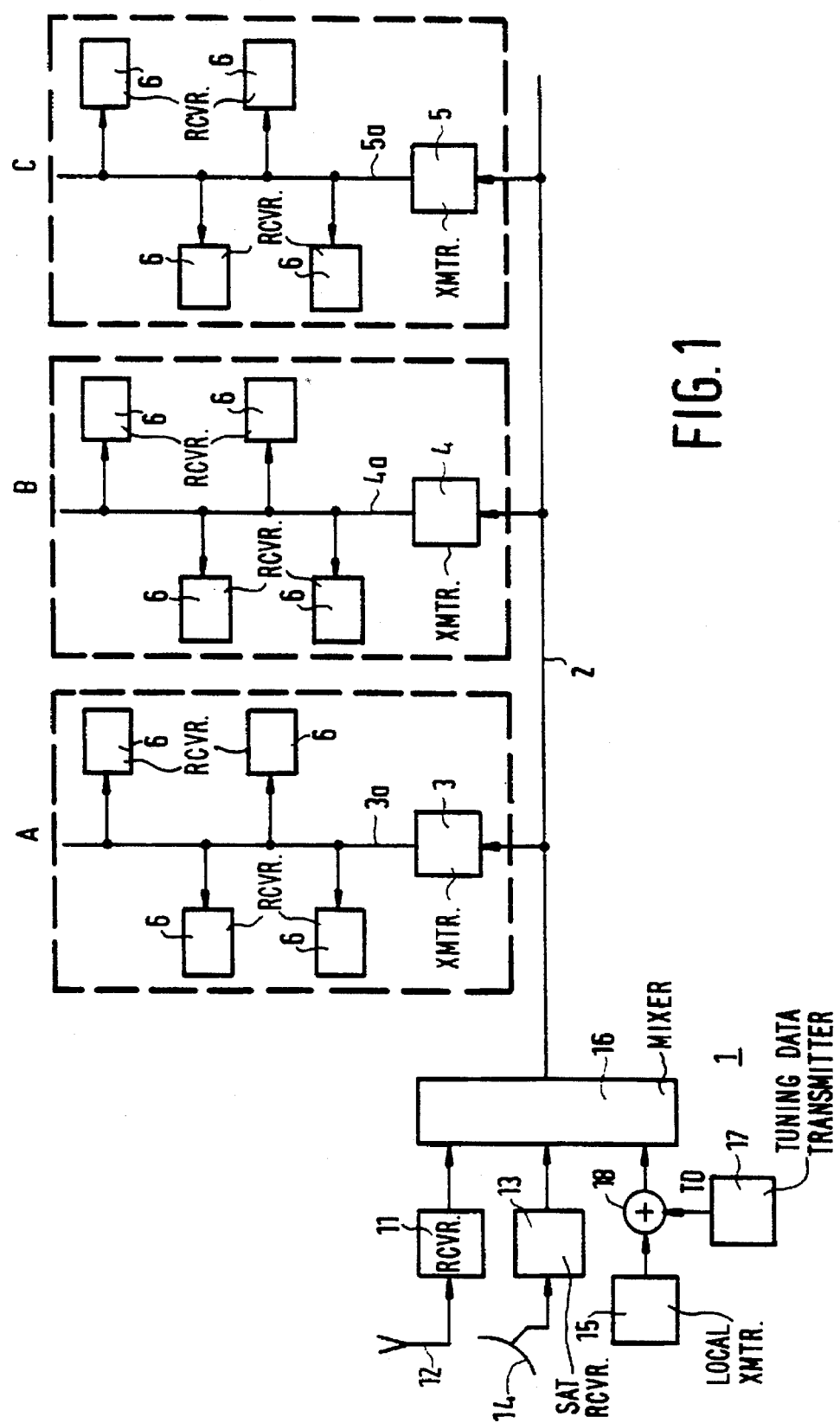

Page 1BA

| PR | FR | TN |
|---|---|---|
| 1 | 203.00 | NAT1 |
| 2 | 697.00 | NAT2 |
| 3 | 444.00 | NAT3 |
| 4 | 189.00 | SAT1 |
| 5 | 511.25 | SAT2 |

FIG. 2A

Page 1BB

| PR | FR | TN |
|---|---|---|
| 1 | 444.00 | NAT1 |
| 2 | 511.25 | NAT2 |
| 3 | 189.00 | NAT3 |
| 4 | 175.25 | SAT1 |
| 5 | 697.00 | SAT2 |

FIG. 2B

Page 1BC

| PR | FR | TN |
|---|---|---|
| 1 | 444.00 | NAT1 |
| 2 | 511.25 | NAT2 |
| 3 | 48.25 | NAT3 |
| 4 | 175.25 | SAT1 |
| 5 | 697.00 | SAT2 |

FIG. 2C

Page 1BE

| AR | FC | LB | PN |
|---|---|---|---|
| AAAAA | 203.00 | | 1BA |
| BBBBBBBB | 189.00 | P1008 | 1BB |
| CCC | 48.25 | | 1BC |

FIG. 3

TRANSMISSION OF TUNING DATA OF BROADCASTING TRANSMITTERS TO A RECEIVER TO FACILITATE AUTOMATED SET-UP OF THE RECEIVER BASED ON RECEIVABLE TRANSMITTERS IN A RECEPTION AREA

BACKGROUND OF THE INVENTION

1. Field of the Invention

The invention relates to a device and a method for transmitting tuning data of broadcasting transmitters to a receiver. Tuning data are herein understood to mean data, for example, a transmission frequency or a channel number, by means of which a broadcasting transmitter can be selected from a plurality of transmitters. The invention also relates to a broadcast receiver for receiving the transmitted tuning dam. Examples of such broadcast receivers are radio receivers, television receivers and video recorders.

2. Description of the Related Art

Modern broadcast receivers are generally tuned to a desired transmitter by applying the transmission frequency or the channel number of this transmitter to a tuner. However, the user does not need to know the relevant frequency or channel number. He selects a transmitter by means of a program number. This is popularly referred to as preset tuning. The transmission frequency or the channel number of the corresponding transmitter is stored for each program number in a tuning memory. When the receiver is used for the first time, the tuning memory is to be programmed by way of an installation procedure. When a new television transmitter is introduced, it is also often desirable to modify program numbers which have already been allocated.

EACEM Technical Note 001/94-01-17, draft 2.0, Jan. 14, 1994 describes a device for transmitting tuning data in cable television networks. The device, accommodated at the headend of a cable network, transmits a tuning data packet in the form of a special teletext page through one of the broadcasting transmitters. For each receivable transmitter, the transmission frequency or channel number is coupled to a program number in said tuning data packet. The installation procedure comprises the reception of said tuning data packet and the storage of the accommodated tuning data in the tuning memory of the receiver, with the memory being addressed by the program number. The receiver can then be tuned to all receivable transmitters by means of the program number as defined by the manager of the head end transmitter. Generally, this will comply with the user's wishes.

The channel distribution may change from cable network to cable network. To avoid the use of a Separate teletext inserter for each cable network, the known device can transmit a plurality of tuning data packets simultaneously. The device is accommodated in a transmitter which can be received in every reception area formed by a cable network. The transmitter then transmits a reference packet in the form of a further teletext page in which the address, i.e, the teletext page number of the corresponding tuning data packet, is fixed for each reception area.

It is now up to the user to indicate in which area the receiver is present in order that the tuning data packet for this area is fixed. The interaction required for this purpose does not render it possible for the installation procedure to be fully automated. Moreover, interaction requires the presence of a display. Consequently, for example, menu-controlled video recorders cannot be installed until an operative connection with a television set has been established.

SUMMARY OF THE INVENTION

It is an object of the invention to provide a device for transmitting tuning data obviating said drawbacks. More particularly, it is an object of the invention to provide a device with which a receiver can be installed in a plurality of reception areas without any further interaction on the user's part.

To this end, the device according to the invention is characterized in that the reference packet for each reception area comprises the tuning data of a transmitter which is receivable by means of said tuning data in said area only. It is thereby achieved that each reception area is characterized by a transmitter which can only be received in that area via the given transmission frequency or channel number. Thus, it is made possible for a receiver to determine itself in which reception area it is present. To this end, the receiver successively tunes to the transmitters mentioned in the reference packet until the transmitter which is characteristic of a region is received.

It is feasible that some transmission frequencies are used in one reception area only. In that case the simple reception of a transmitter at such a frequency is sufficient to localize the area. However, transmission frequencies or channel numbers are often also used in other reception areas, but then for other transmitters. In such situations a further embodiment of the device is characterized in that, for each tuning data, a recognition label in the reference packet is transmitted to recognize the transmitter using said tuning data. By comparing this recognition label with an identification label transmitted by the transmitter itself, a receiver can now determine whether a received transmitter is actually the transmitter characteristic of an area, or whether it is a "different" transmitter.

The recognition label may have various forms. Very suitable is the transmission of the source code which is already transmitted by many transmitters, in practice, for VPS (Video Programming System) or PDC (Program Delivery Control). A part of the teletext page headers of a transmitter, for example the character string occurring therein and indicating the transmitter name is also feasible.

BRIEF DESCRIPTION OF THE DRAWINGS

FIG. 1 shows a system for distributing radio and/or television programs to a plurality of receivers, provided with a device according to the invention.

FIGS. 2A–2C show examples of tuning data packets which are transmitted by a device shown in FIG. 1.

FIG. 3 shows an example of a reference packet which is transmitted by the device of FIG. 1.

DESCRIPTION OF THE PREFERRED EMBODIMENTS

Figure 4:
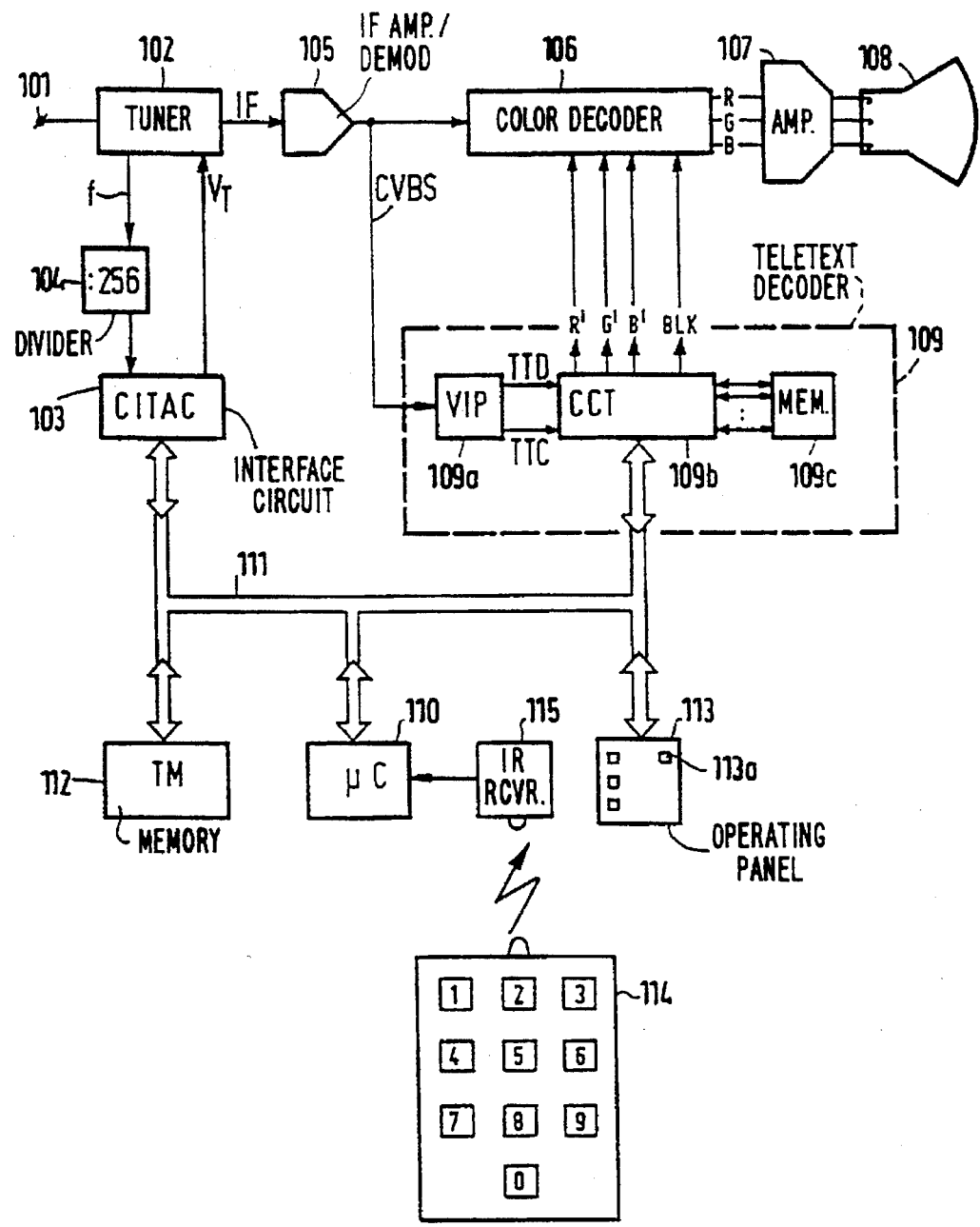
FIG. 4 shows diagrammatically the general structure of a broadcast receiver according to the invention.

FIG. 1 shows a system for distributing radio and/or television programs to a plurality of receivers. The system comprises a headend transmitter 1 which applies the programs via a medium 2, for example, a glass fiber cable to different distributing transmitters 3, 4 and 5. Each distributing transmitter distributes the programs within a given area (A, B, C) by means of a cable network (3a, 4a, 5a). A plurality of receivers 6 is connected to each cable network. The frequency spectrum of each cable network is customarily divided into transmission channels to which distinct carrier frequencies or channel numbers are allocated.

As is shown in FIG. 1, the headend transmitter 1 comprises means 11 for receiving terrestrial transmitters via an antenna 12, and means 13 for receiving satellite transmitters via one or more dishes 14. The headend transmitter also comprises a local radio and/or television transmitter 15 which transmits a local program. The transmitter signals are combined in a mixer circuit 16 and applied to the glass fiber cable 2.

Moreover, the headend transmitter comprises a device 17 for transmitting the tuning data TD of the transmitters, this data being distributed by the headend transmitter. In the example shown, the tuning data are added to the local program via an adder circuit 18. If there is no local transmitter, the tuning data may be supplied, if desired, to one of the terrestrial or satellite transmitters and transmitted thereby. Television transmitters preferably transmit the tuning data in teletext pages. Radio transmitters may transmit the tuning data in the RDS signal. The transmission of tuning data by television transmitters will hereinafter be elucidated. Device 17 is then constituted by a teletext page generator and adder circuit 18 is constituted by a teletext inserter. These apparatuses are generally known and need not be further described.

The distributing transmitters 3, 4 and 5 are supposed to distribute the same television programs. However, the channel allocation in each of the reception areas A, B, C is supposed to be different. Yet, it is customary to allocate the same program numbers to the same transmitters everywhere. To render this possible, a separate tuning data packet is created for each reception area by means of device 17. To this end, a teletext page (hereinafter referred to as tuning page) is composed for each area. It will be assumed, in the following example, that three national terrestrial transmitters NAT1, NAT2 and NAT3 and two satellite transmitters SAT1 and SAT2 are distributed by the headend transmitter. FIG. 2A shows the tuning page for reception area A. This page has the hexadecimal page number 1BA. FIG. 2B shows the tuning page with page number 1BB for reception area B, and FIG. 2C shows the tuning page with page number 1BC for tuning area C. An extensive description of the structure and transmission of tuning pages can be found in European Patent Application EP 0263555, corresponding to U.S. Pat. No. 4,894,714, and in the non-prepublished Patent Applications PHN 14.460, corresponding to U.S. patent application Ser. No. 08/241,811, filled May 12, 1994, and PHN 14.461, corresponding to U.S. patent application Ser. No. 08/528,749, filed Sep. 15, 1995, in the name of the Applicant. For the sake of completeness, it is only noted here that the columns shown in FIGS. 2A–2C successively comprise, for each receivable transmitter: a program number PR 21, the tuning data 22 in the form of the transmission frequency FR in MHz (channel number, if any) and a displayable transmitter name TN 23.

In addition to the tuning data packets, a reference packet in the form of a further teletext page, hereinafter referred to as reference page, is also created. The reference page has a predetermined page number, preferably a standardized number which is automatically searched by a receiver if an installation procedure is being performed. FIG. 3 shows an embodiment of the reference page, here denoted by page number 1BE. The page comprises, for each reception area, at least the tuning data 31 (here the transmission frequency FC in MHz) of a transmitter characteristic of said area and an address 32 (here the teletext page number PN) of the tuning data packet for that area. Moreover, a recognition label LB 33 may be allocated to one or more of the mentioned transmitters, and the reception areas may also be displayed in a readable text AR 34 (for example, the name of the region, town or district).

The expression "transmitter characteristic of an area" will now be further explained. It is apparent, from a consideration of the tuning pages shown in FIGS. 2A–2C, that the 203.00 MHz transmission frequency is used in area A only. In other words, when a television receiver receives a transmitter at 203.00 MHz, this receiver is unambiguously located in reception area A. The transmitter at frequency 203.00 MHz is thus characteristic of area A and is therefore mentioned as such in the reference page. It is further irrelevant whether this is the transmitter NAT1. For the same reason, the transmitter NAT3 at 48.25 MHz is characteristic of reception area C. In fact, the frequency 48.25 MHz is nowhere further used. However, the situation is different in reception area B: all frequencies used here are also used elsewhere. A further consideration of the tuning pages shows, however, that the frequency 189.00 MHz in area A is used for SAT1, in area B for NAT3, and is not used in area C. In other words, when a television receiver receives a transmitter at 189.00 MHz and can also ascertain that it is the transmitter NAT3, then the receiver is present in area B. To be able to ascertain whether the received transmitter is indeed a specific transmitter, use is made of the fact that many radio and television transmitters transmit an identification code in practice. This identification code is now coded in a label LB (33 in FIG. 3) in the reference page. By means of this label, a receiver can ascertain whether the transmitter received at 189.00 MHz is indeed the transmitter NAT3. If that is true, then the receiver is unambiguously in reception area B. The transmitter at frequency 189.00 MHz with the corresponding label is thus characteristic of area B.

Various embodiments are feasible for coding the recognition label 33. Possible coding forms are, for example:

V<nnnn> for indicating a source code nnnn of transmitters which transmit this source code by means of VPS (Video Programming System).

P<nnnn> for indicating a source code nnnn of transmitters which transmit this source code in teletext packet 8/30 of PDC (Program Delivery Control).

T<LLL> for indicating a character string LLL (for example BBC1, ARD) occurring in the teletext page headers of a transmitter. Said coding forms have the pleasant property that they can be randomly used within a reference page. In FIG. 3, in which only the transmitter NAT3 characteristic of reception area B is provided with a recognition label, the PDC source cede (1008) of this transmitter is used for this purpose.

FIG. 4 shows, diagrammatically, the general structure of a broadcast receiver according to the invention. A television receiver has been taken as an example. Other broadcast receivers, such as video recorders and radio receivers, have a similar structure and need not be explained separately.

The receiver shown in FIG. 4 has an antenna input 101 which is connected to the cable network (3a, 4a, 5a in FIG. 1). The received antenna signal is applied to a tuner 102. This tuner receives a tuning voltage $V_T$ from an interface circuit 103. The Philips IC SAB 3035 known under the name of CITAC (Computer Interface for Tuning and Analog Control) may be chosen as an interface circuit. The tuner 102 supplies an oscillator signal of the frequency f and, after division by 256 in a frequency divider 104, it returns this signal to the CITAC 103. Thus, tuner 102, CITAC 103 and divider 104 constitute a frequency synthesis circuit. If a tuning frequency or channel number is applied to the CITAC, the tuner autonomously tunes to this frequency or channel number.

The tuner 102 applies an intermediate frequency signal IF to an intermediate frequency amplification and demodulation circuit 105 which supplies a baseband video signal CVBS. The Philips IC TAD 2540 may be chosen for circuit 105. The video signal CVBS is applied to a color decoder 106 which supplies color signals R, G, B which in their turn are applied via an amplifier circuit 107 to a display screen 108 for display of the received TV program. Moreover, color decoder 106 receives additional color signals R', G' and B' and a blanking signal BLK by which the color signals R, G and B can be suppressed completely or locally. A Philips IC of the TDA 356X family may be chosen for the color decoder 106.

The video signal CVBS is also applied to a teletext decoder 109. This decoder comprises a video input processor 109a which receives the video signal CVBS, separates the teletext signal therefrom and applies it through a data line TTD to a circuit 109b which will be referred to as Computer Controlled Teletext decoder (abbreviated CCT decoder). The decoder also receives a clock signal from the video input processor 109a via a clock line TTC. It is further coupled to a memory 109c in which one or more teletext pages can be stored and which is therefore referred to as page memory. The CCT decoder supplies the three previously mentioned elementary color signals R', G' and B' and the blanking signal BLK. The CCT decoder is also suitable for displaying locally generated On-Screen-Display information. The video input processor 109a may be constituted by the Philips IC SAA 5230, the CCT decoder 109b may be the Philips IC SAA 5240, and the page memory 109c may be an 8 kbyte RAM. For an extensive description of structure and operation of the teletext decoder 109, reference is made to "Computer Controlled Teletext", Electronic Components and Applications, vol. 6, no. 1, 1984, pp. 15-29.

The receiver further comprises a control circuit 110 in the form of a microcomputer. A microcomputer of the MAB 84xx family of Philips may be used for this purpose. The microcomputer is coupled via a bus system 111 to the teletext decoder 109, the CITAC 103, a non-volatile memory 112 and a local operating panel 113. The non-volatile memory 112, which will further be referred to as tuning memory TM, is used for storing, inter alia, the tuning data of receivable television programs. The user can program the tuning memory at will by means of the local operating panel 113, i.e, he can arbitrarily store the tuning data of desired television programs under a preset number. This further known method of programming the tuning memory is also referred to as "manual programming". The local operating panel further comprises an installation key 113a for automatic programming.

A hand-held remote control unit 114 is used for the daily operation of the receiver. This unit transmits infrared operating signals to an infrared receiver 115 which is connected to an input of microcomputer 110. The remote control unit 114 comprises a plurality of keys 0 to 9 and also the customary keys (not shown) for controlling picture and sound, switching on a teletext mode and the like.

The operation of the television receiver is further determined by a control program which is stored in the memory of microcomputer 110. In a normal operating mode, the receiver is tuned by generating a program number by means of one or more keys. The transmission frequency of a television transmitter is fixed in the tuning memory 112 for each program number. The relevant frequency is read by the microcomputer 110 and applied as tuning frequency to the CITAC 103.

Figure 5:
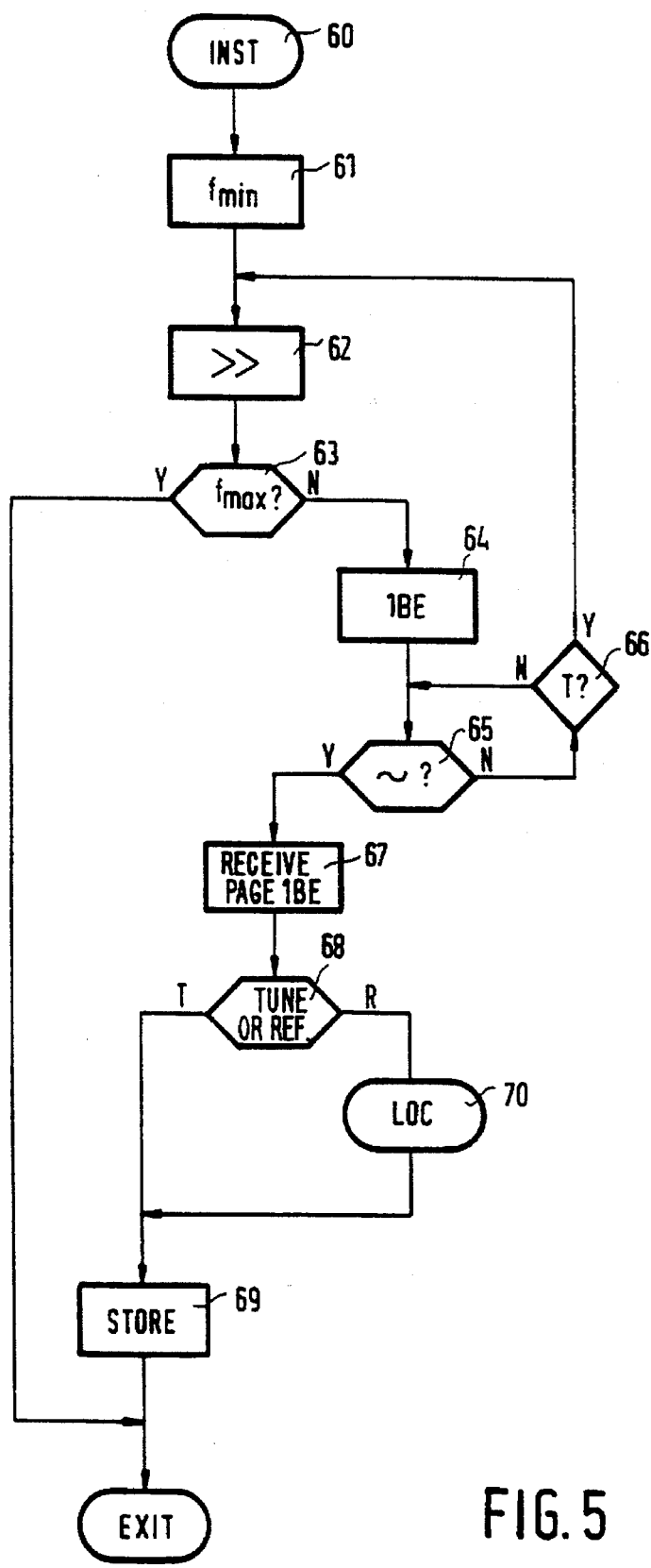
FIG. 5 shows a flowchart to explain an installation program performed by a microcomputer shown in FIG. 4.

If the installation key 113a is depressed, the microcomputer performs an installation program INST which will now be explained with reference to a flowchart shown in FIG. 5. In a step 61 of this program, a minimum tuning frequency $f_{min}$ is applied to the CITAC. Subsequently, in a step 62, a search procedure is started in which the tuning frequency is step-wise increased until a television signal is received. When a maximum frequency $f_{max}$ is exceeded (step 63) in the search, the installation program is ended.

While the receiver is tuned to a television transmitter thus found, the microcomputer supplies the page number 1BE to the teletext decoder in a step 64. This is the number of the reference page or, if only one tuning page is transmitted, the number of this tuning page. The teletext decoder now starts the acquisition of this page. However, it is not known in advance whether the instantaneously received transmitter is the desired transmitter transmitting the tuning data. While a waiting time of the requested teletext page is observed, the teletext decoder receives teletext page headers and writes them into the page memory 109c (see FIG. 4). In a step 65, the program checks whether a special code (~) occurs in the page headers. In the non-prepublished Patent Application PHN 14.460 in the name of the Applicant, the use of this code ~ is shown in the teletext page headers so as to be able to find the transmitter rapidly. If the code ~ is not found within a short time T, for example, ½ second, then the received transmitter is not the desired transmitter with tuning data (step 66). The installation program then returns to the step 62 so as to find a subsequent transmitter. The program loop thus formed is terminated as soon as it has been found in the step 63 that the maximum transmission frequency $f_{max}$ is reached without the desired transmitter having been found. In that case, the user may be notified, for example, that he should resort to manual programming.

If, in the step 65, the transmitter with tuning data has been recognized, the teletext decoder waits for the reception of teletext page 1BE in a step 67. The page is then stored in the page memory. The microcomputer subsequently checks, in a step 68, whether page 1BE is a tuning page (T) or a reference page (R). To this end, the page may be provided with recognition symbols. If desired, the microcomputer may analyze the division of the page and ascertain whether it has a layout in accordance with one of the FIGS. 2A-2C or in accordance with FIG. 3. If page 1BE is a tuning page, then it is assumed to be the only tuning page. In a step 69, the tuning data transmitted therein are stored in the tuning memory 112 (see FIG. 4) of the receiver. Said step 69 is extensively elucidated in European Patent Application EP 0263555 and in the non-prepublished Patent Application PHN 14.460 in the name of the Applicant. The installation procedure is terminated when the tuning data have been stored in the memory.

Figure 6:
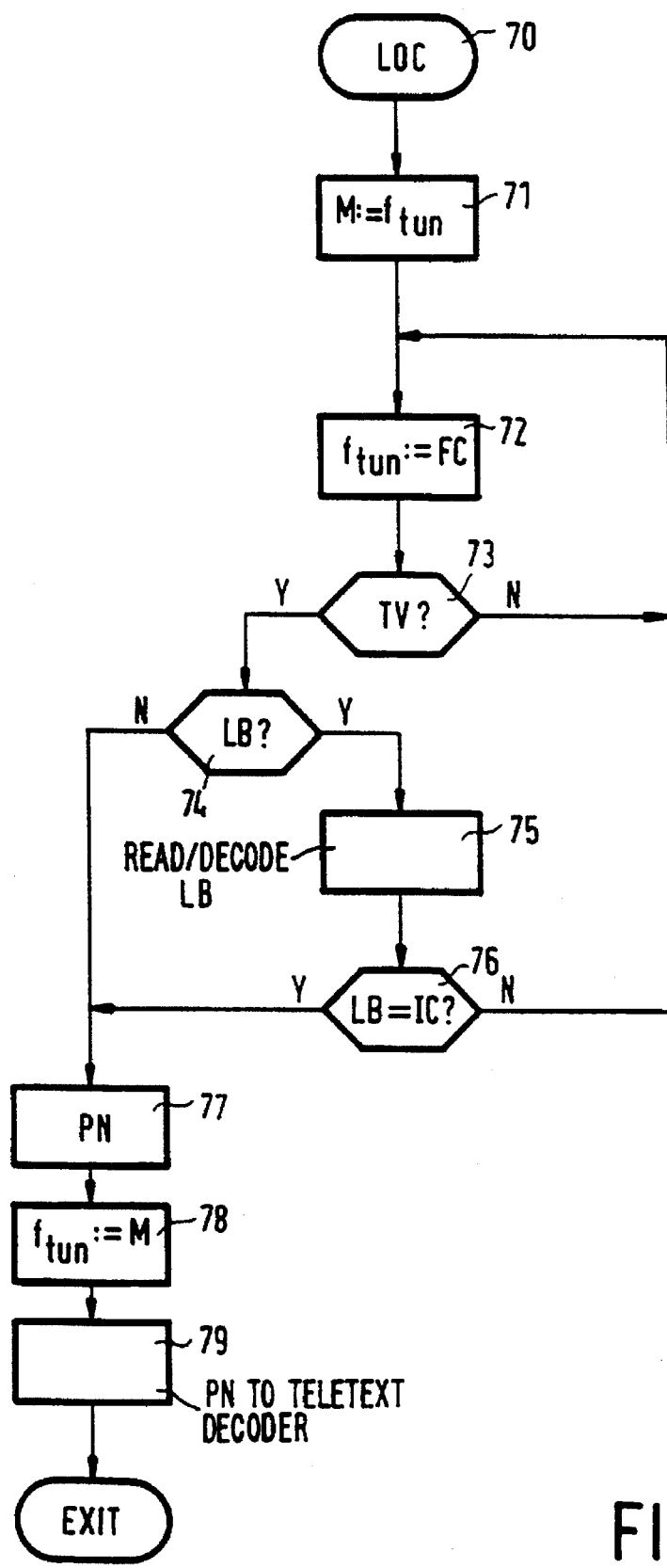
FIG. 6 shows a flowchart to explain a sub-program shown in FIG. 5.

If page 1BE is a reference page, a sub-program LOG 70 is performed for localizing the reception area in which the receiver is present and for determining the tuning page corresponding thereto. The sub-program LOG will now be explained with reference to a flowchart shown in FIG. 6. First, a step 71 is performed in which the instantaneous tuning frequency $f_{tun}$ (i.e., the transmission frequency of the transmitter with tuning data) is preserved. Subsequently the processor reads, in a step 72, the transmission frequency FC (31 in FIG. 3) of the transmitter which is the first transmitter mentioned in the reference page and applies this frequency to the CITAC. Referring to the example shown in FIG. 3, this means that the receiver is tuned to 203.00 MHz. In a step 73, it is ascertained whether a television signal TV is indeed received in response to this tuning. It will as yet be assumed that a transmitter is indeed received at 203.00 MHz. In a step 74, the sub-program then ascertains whether the reference page mentions a recognition label LB (33 in FIG. 3) for this transmitter. This is not the case in the relevant example. The simple reception of a transmitter at 203.00 MHz is now sufficient to conclude that the receiver is in reception area A. If desired, the user may be informed thereof by displaying the name of the region, town or district (34 in FIG. 3) on the display screen.

If no TV signal is received in step 73 (i.e., because the receiver is in an area other than area A), the sub-program will return to step 72 in order to tune the receiver to a subsequent transmitter mentioned in the reference page. Again referring to FIG. 3, this means that the receiver is now tuned at 189.00 MHz. The sub-program now reaches a step 75 because a recognition label LB (33 in FIG. 3) for this frequency is incorporated in the reference page. In the step 75, this label is read and decoded. The previous description has already dealt with the possible forms of coding (V<nnnn>, P<nnnn>, T<LLL>) and their significance. In a step 76, it is ascertained whether the label corresponds to an identification code IC which is transmitted by the received transmitter. If the recognition label were, for example, T<BBC1>, it will be ascertained in this step whether the character string BBC1 occurs in the teletext page headers. In the present example, the recognition label is P<1008> and it is thus ascertained whether the transmitter at 189.00 MHz transmits the source code 1008 in teletext packet 8/30. This is only the case if the receiver is in reception area B. It is true that a transmitter is also receivable at 189.00 MHz in area A (viz., the transmitter SAT1, see FIG. 2A), but this transmitter does not have the source code 1008. Thus, reception area B can also be localized by the receiver.

If the label and the identification code are not in conformity with each other, the sub-program returns to step 72 to search a subsequent transmitter. Again, referring to FIG. 3, the receiver is then tuned at 48.25 MHz. At this frequency, only a transmitter in reception area C can be received. Since a recognition label LB is absent at the frequency of 48.25 MHz, the simple reception of the relevant transmitter is again sufficient to localize area C.

After the reception area has been localized in the manner described above, the microcomputer reads, in a step 77, the page number PN (32 in FIG. 3) mentioned in the reference page of the tuning page for the localized area. However, the receiver is no longer tuned to the transmitter transmitting the tuning pages. In a step 78, the receiver is therefore tuned to this transmitter again. This proceeds most rapidly when using the previously stored (in step 71) transmission frequency of this transmitter. Subsequently the page number PN which has just been fixed is applied in a step 79 to the teletext decoder. Dependent on the reception area, this is page number 1BA, 1BB or 1BC. This terminates the localization subprogram. After reception of the tuning page, the transmitted tuning data are subsequently stored in the tuning memory (step 69 in FIG. 5) and the installation procedure for the receiver has been performed fully automatically.

It is to be noted that the order of mentioning the reference data in the reference page is in principle arbitrary. However, an accurately selected order provides advantages, provided that the receiver tunes to transmitters in the order in which they are mentioned. For example, in the order chosen in FIG. 3, the label P<1008> may in fact be omitted because upon tuning at 189.00 MHz, it has already previously been ascertained that the receiver is not in area A. This unambiguously proves that the receiver is in area B.

A very great advantage of the device according to the invention is that its use is not limited to cable networks. It is likewise feasible that the manager of a national terrestrial transmitter network transmits the tuning pages for the various regions through one of the television programs, accompanied by a reference page for localizing these regions. The invention is also applicable to future modem transmission networks in which a plurality of programs is distributed in a coded form as an MPEG bit stream. In that case, the tuning data are not constituted by a transmission frequency or a channel number but by a Program Identification PID which is incorporated in packet headers of the bit stream.

I claim:

1. A device for transmitting tuning data of broadcasting transmitters to a receiver, said device comprising:

means for generating, for a plurality of reception areas, a tuning data packet comprising tuning data of the transmitters which are receivable in each of said areas;

means for generating a reference packet identifying the corresponding tuning data packet for each one of the plurality of reception areas; and means for transmitting said tuning data packets and said reference packet, characterized in that the reference packet for each reception area comprises the tuning data of a transmitter which is receivable only in said area using said tuning data.

2. A device as claimed in claim 1, characterized in that said device further comprises means for generating a recognition label for each tuning data in the reference packet to identify the transmitter using said tuning data, said recognition label being transmitted by said transmitting means.

3. A device as claimed in claim 2, characterized in that the recognition label comprises an identification code transmitted by the transmitting means.

4. A device as claimed in claim 2, characterized in that the recognition label comprises a part of teletext page headers of the transmitter.

5. A method of transmitting tuning data of broadcasting transmitters to a receiver, comprising the steps:

transmitting, for a plurality of reception areas, a tuning data packet comprising the tuning data of the transmitters which are receivable in each of said areas; and transmitting a reference packet which identifies the corresponding tuning data packet for each one of the plurality of reception areas, characterized in that the reference packet for each reception area comprises the tuning data of a transmitter which is receivable only in said area using said tuning data.

6. A method as claimed in claim 5, characterized in that a recognition label is transmitted for each tuning data in the reference packet so as to recognize the transmitter using said tuning data.

7. A method as claimed in claim 6, characterized in that the recognition label comprises an identification code transmitted by the transmitter.

8. A method as claimed in claim 6, characterized in that the recognition label comprises a part of the teletext page headers of the transmitter.

9. A broadcast receiver, comprising:

a tuning unit for tuning the receiver to a transmitter by means of a supplied tuning data;

a tuning memory for storing tuning data;

means for receiving a tuning data packet with tuning data of transmitters which are receivable in a reception area, and a reference packet identifying a tuning data packet for each of a plurality of reception areas;

a control circuit coupled to said tuning unit, said tuning memory and said receiving means for causing the tuning data from a tuning data packet selected by said receiving means to be stored in the memory, characterized in that the reference packet for each reception area comprises the tuning data of a transmitter which is receivable only in said area using said tuning data; and the control circuit applies the tuning data from the reference packet to the tuning unit until said transmitter is received, and selects the tuning data packet corresponding to said area.

10. A receiver as claimed in claim 9, characterized in that the control circuit further compares a recognition label which is transmitted for a tuning data with an identification label which is transmitted by a transmitter using said tuning data.

* * * * *